US010404519B2

(12) United States Patent
Menkhoff et al.

(10) Patent No.: US 10,404,519 B2
(45) Date of Patent: Sep. 3, 2019

(54) METHOD AND AN APPARATUS FOR DETERMINING A NOISE SHAPED QUANTIZED PARAMETER CONTRIBUTING TO THE GENERATION OF AN OUTPUT SIGNAL

(71) Applicant: Intel IP Corporation, Santa Clara, CA (US)

(72) Inventors: Andreas Menkhoff, Oberhaching (DE); Mohamed Ibrahim, Stuttgart (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/750,257

(22) PCT Filed: Aug. 2, 2016

(86) PCT No.: PCT/IB2016/054645
§ 371 (c)(1),
(2) Date: Feb. 5, 2018

(87) PCT Pub. No.: WO2017/051268
PCT Pub. Date: Mar. 30, 2017

(65) Prior Publication Data
US 2018/0262384 A1    Sep. 13, 2018

(30) Foreign Application Priority Data

Sep. 25, 2015  (DE) .................. 10 2015 116 246

(51) Int. Cl.
*H04L 27/36*     (2006.01)
*G01R 29/26*    (2006.01)
*H04L 27/20*     (2006.01)

(52) U.S. Cl.
CPC ............ *H04L 27/368* (2013.01); *G01R 29/26* (2013.01); *H04L 27/2092* (2013.01); *H04L 27/361* (2013.01); *H04L 27/365* (2013.01)

(58) Field of Classification Search
CPC ..................................................... H04L 27/368
(Continued)

(56) References Cited

U.S. PATENT DOCUMENTS 5,802,487 A * 9/1998 Tanaka .................... G10L 19/07
704/219
6,421,400 B1 * 7/2002 Rhee .................... H04L 1/0054
375/265
(Continued)

OTHER PUBLICATIONS

Roverato, E. et al.: RX-Band Noise Reduction in All-Digital Transmitters With Configurable Spectral Shaping of Quantization and Mismatch Errors, In: IEEE Transactions on Circuits and Systems, Regular Papers, vol. 61, No. 11. Nov. 2014, p. 3256-3265. XP011562761.

*Primary Examiner* — Lihong Yu
(74) *Attorney, Agent, or Firm* — 2SPL Patent Attorneys PartG mbB

(57) ABSTRACT

A method for determining a noise shaped quantized parameter contributing to generation of an output signal comprises estimating an error within the output signal using a quantization of the parameter and a quantization of a further parameter contributing to generation of the output signal. The quantization of the parameter is used as the noise shaped quantized parameter according to a selection criterion.

10 Claims, 6 Drawing Sheets

(58) Field of Classification Search
USPC .......................................................... 375/296
See application file for complete search history.

(56) References Cited

U.S. PATENT DOCUMENTS

| | | |
|---|---|---|
| 2003/0053234 A1 | 3/2003 | Patapoutian et al. |
| 2005/0003785 A1* | 1/2005 | Jackson .................... G01S 7/35 |
| | | 455/260 |
| 2005/0238124 A1 | 10/2005 | Becker et al. |
| 2011/0082656 A1 | 4/2011 | Todorokihara |
| 2011/0282625 A1 | 11/2011 | Craninckx et al. |
| 2015/0042310 A1 | 2/2015 | Gazsi et al. |

* cited by examiner

Conclusion 6: Only a narrow signal spectrum $R_{ss}(\omega)$ preserves a deep notch in the polar domain.

A broad signal spectrum $R_{ss}(\omega)$ flats a deep notch in the polar domain

METHOD AND AN APPARATUS FOR DETERMINING A NOISE SHAPED QUANTIZED PARAMETER CONTRIBUTING TO THE GENERATION OF AN OUTPUT SIGNAL

FIELD

Examples relate to a method for determining a noise-shaped quantized parameter which contributes to the generation of an output signal as well as to a corresponding noise shaper.

BACKGROUND

Quantization of continuous parameters or re-quantization of quantized parameters is a common task in digital signal processing, causing a quantization error. In order to reduce the impact of the introduced quantization error, noise shaping is often used in order to minimize the error energy introduced by means of the quantization in a frequency range of interest. To this end, it is determined that the spectrum of a noise-shaped quantized parameter exhibits a noise component or a noise floor which contains a reduced amount of error energy within a frequency range of particular interest. Application scenarios for noise shaping are various.

For example, in a wireless telecommunications application, there may be some points where the word length of a digital signal is reduced. For example, when numerically exact digital signal processing circuits steer analog circuits like, for example, a digital-to-analog converter (DAC), a digitally-controlled oscillator (DCO) or a digital-to-time converter (DTC), quantization of the exact steering values may be required for implementation reasons. Noise shaping and quantization of the steering values results in output data stream of an associated series of noise shaped quantized parameters. Example for steering values are a digital in-phase (I) quadrature (Q), radius (R), phase (Φ) and frequency data. Quantizing those input data streams and shaping the noise according to the requirements results in an output data stream having data words with reduced word length for each of the I, Q, R, Φ and frequency data streams. While noise shaping each of the input data streams independently may result with a satisfactory noise behavior of each of the output data streams. However, when a quantized parameter contributes to the generation of an output signal together with a further quantized parameter the desired spectral properties of the output signal may not be achievable using those conventional noise shaping approaches. In wireless transceivers, for example, a transmitted radio frequency (RF) signal or an associated baseband signal is often generated using two quantities, for example an I- and a Q-component or, an R- and a Φ-component in the polar implementation of the transceiver. While the two components contributing to the generation of the radio frequency or baseband signals may individually exhibit the desirable spectral behavior when noise shaped independently from one another, the resultant RF or baseband output signal may not.

Hence, there may be a desire, to improve noise shaping for quantized parameters contributing to the generation of an output signal.

BRIEF DESCRIPTION OF THE FIGURES

Some embodiments of apparatuses and/or methods will be described in the following by way of example only, and with reference to the accompanying figures, in which.

DETAILED DESCRIPTION

Figure 1:
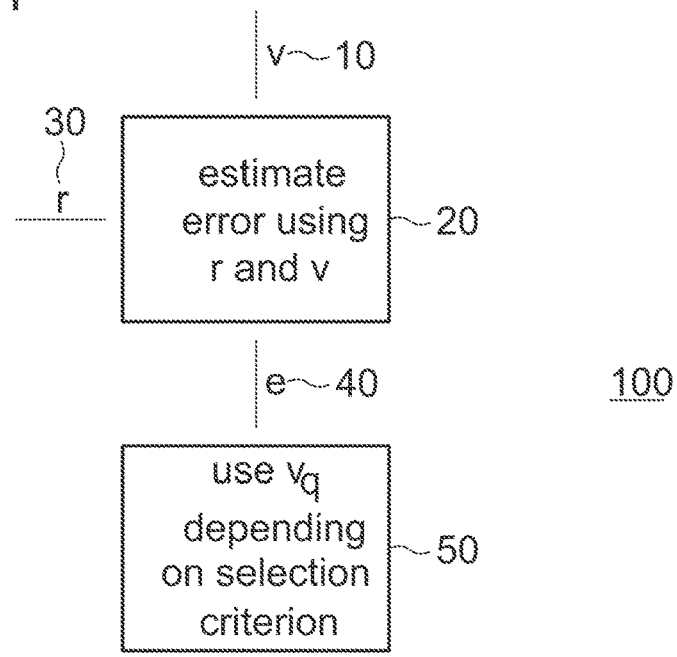
FIG. 1 illustrates a flowchart of an example of a method for determining a noise-shaped quantized parameter.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent,", to name just a few examples.

The terminology used herein is for the purpose of describing particular examples is not intended to be limiting for further examples. Whenever a singular form such as "a," "an" and "the" is used and using only a single element is neither explicitly or implicitly defined as being mandatory, further examples may also plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong, unless expressly defined otherwise herein.

In the following, various examples relate to devices (e.g. cell phone, base station) or components (e.g. transmitter or radio frequency generator, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In these examples, the mobile communication system may comprise mobile transceivers, relay station transceivers and base station transceivers. The relay station transceivers and base station transceivers can be composed of one or more central units and one or more remote units.

A mobile transceiver or mobile telecommunications device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may, for example, correspond to a remote radio head, a transmission point or an access point. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. A cell may be a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

FIG. 1 illustrates a flowchart of an example of a method for determining a noise-shaped quantized parameter $v_q$ contributing to the generation of an output signal. In an error estimation step 20, an error 40 ($e$) within the output signal is estimated using a quantization of the parameter 10 ($v$) as well as a quantization of a further parameter 30 ($r$), which contributes to the generation of the output signal as well. The quantization of the parameter is used as the noise-shaped quantized parameter $v_q$ according to a selection criterion. The decision of use is made in a decision step 50, which bases the decision on the estimated error 40.

In considering not only the quantization of the parameter 10 to be generated using noise shaping but also a further parameter contributing to the generation of the output signal, the signal characteristics of the output signal may be further enhanced. In particular, a noise component within the output signal appearing at a notch frequency may be maintained lower as compared to an approach where the parameter is quantized and noise shaped independently from the further parameter.

According to some examples, a first estimated error within the output signal is calculated using a first quantization of the parameter together with the quantization of the further parameter and a second estimated error within the output signal is calculated using a second quantization of the parameter together with the given quantization of the further parameter. According to the selection criterion, the quantization of the parameter resulting in the lower estimated error is used as the noise-shaped quantized parameter. In other words, two estimated errors for the output signal are generated for two possible quantizations of the parameter, while a given quantization of the further parameter is also used for the determination or calculation of the estimated error. In also considering the contribution of the quantization of the further parameter within the output signal, an additional parameter contributing to the error within the output signal is considered and the quality of the noise shaping may be significantly increased as compared to implementations considering only the parameter to be quantized from further parameters.

According to further examples, the estimation of the error within the input signal additionally considers different possible quantizations of the further parameter contributing to the generation of the output signal. In particular, a third estimated error within the output signal is calculated using the first quantization of the parameter and a second quantization of the further parameter. Further, a fourth estimated error within the output signal is calculated using the second quantization of the parameter and the second quantization of the further parameter. The selection criterion considers the four estimated errors and, according to the selection criterion, the quantization of the parameter and the quantization of the further parameter are used which result in the lowest estimated error. For example, the first quantization of the parameter is used as the noise-shaped quantized parameter and the second quantization of the further parameter is used as the noise-shaped quantized further parameter if the corresponding estimated error is the lowest calculated error among the four calculated errors corresponding to the four possible combinations for the quantized parameter and the quantized further parameter.

In further considering also different possible quantizations for the further parameter, the noise shaping characteristics and the noise energy at a notch frequency within the spectrum of the generated output signal may be maintained low. In particular, in applications where the parameter and the further parameter have a high bandwidth and a corresponding rapid change, this may provide a spectrum of the output signal exhibiting superior characteristics as compared to an approach where quantizations are calculated for the individual parameters independently from one another.

According to some examples, the first quantization of either parameter corresponds to the smallest possible distance between the first quantization of the parameter and the input parameter itself, wherein the second quantization corresponds to the second smallest possible distance between the quantization of the parameter and the parameter itself for the given quantization scheme. The quantization steps considered according to the quantization scheme, however, may not necessarily be equidistant in order to benefit from the previously-described approach. The quantization may be uniform or nonuniform.

According to some examples, an information on a notch frequency at which the error within the output signal is desired to be small is additionally used in the calculation of the estimated errors. That is, the estimated error is calculated at a frequency within the spectrum where the error energy is desired to be as small as possible. This may be of particular interest in mobile telecommunication applications, in particular, when the radio frequency signal is directly synthesized. One particular example of directly synthesizing the radio frequency carrier signal is the use of polar modulators in wireless transmitters. In such transmitters, the first parameter to be quantized may correspond to a phase value of an output signal and the further parameter may correspond to a radius value of the output signal. In this event, the phase value may correspond to an instantaneous phase modulation of the radio frequency signal while the radius value may correspond to an amplitude modulation of the radio frequency signal.

Figure 2A:
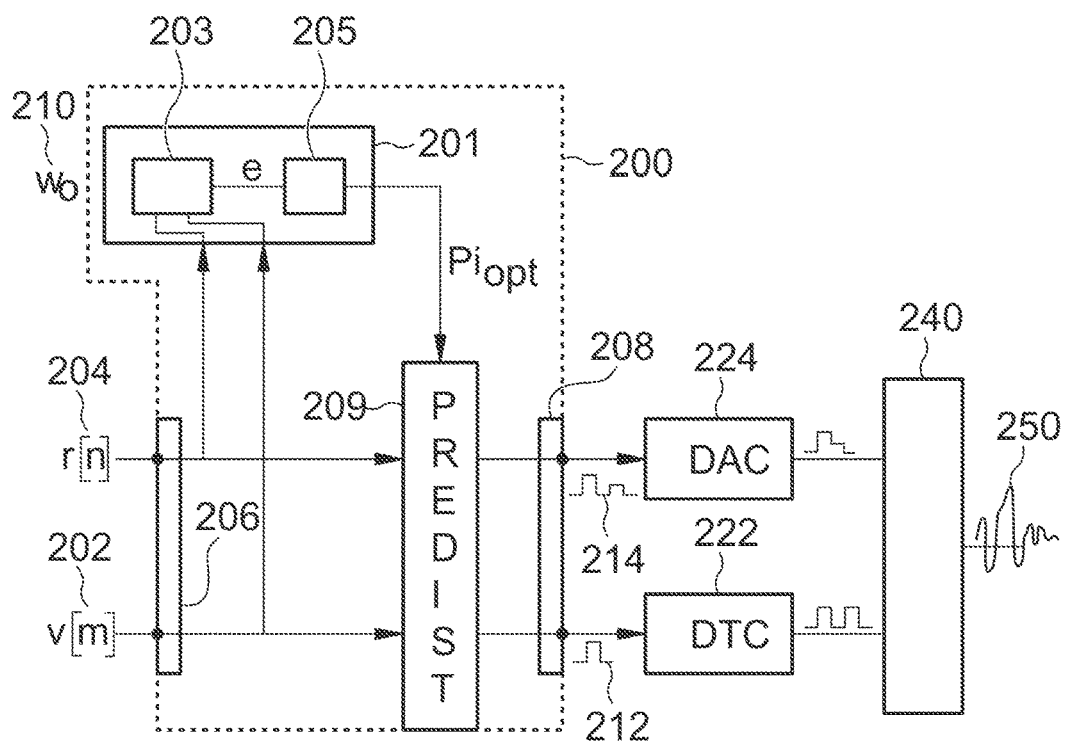
FIG. 2a illustrates an example of a noise shaper for determining a noise-shaped quantized parameter within a radio frequency transmit signal generated using a polar modulator.

FIG. 2a illustrates a particular example of a quantization circuit for determining a noise-shaped quantized parameter based on a parameter contributing to the generation of an output signal together with a further parameter in an application within a polar modulator. The polar modulator synthesizes a radio frequency signal based on phase values 202 and on radius values 204. In the particular example of FIG. 2a, the radius values 204 and the phase values 202 are given as a sequence of discrete-valued samples so that the quantization performed in FIG. 2 can be characterized as a re-quantization. However, further embodiments may also use real-valued (i.e. non-quantized) parameters as an input to a quantization circuit in order to determine a noise-shaped quantized parameter. The quantization circuit 200 comprises first interface circuitry 206 which is configured to receive a representation of a phase value 202 as a representation of the parameter as well as a representation of a radius value 204 as a representation of the further parameter. The first interface circuitry 206 may serve as an input interface to the quantization circuit 200. In a software implementation, the input interface may be implemented as a function or functional entity serving for and being particularly tailored to the purpose of receiving the parameter and the further parameter. In other implementations, the interface circuitry 206 may be a hardware interface configured to receive the parameter and the further parameter, for example by means of data transferred via a data bus. In the example of FIG. 2a, the phase value 202 is associated with the parameter to be quantized and noise-shaped while the radius value 204 is associated to the further parameter which is additionally considered in the noise shaping of the quantized parameter (the phase value 202). However, this is just one particular example. In further examples, the radius value 204 may be the parameter which is to be quantized and noise shaped while in yet further examples, both the radius value 204 and the phase value 202 are quantized as well as noise shaped.

The quantization circuit 200 further comprises a noise shaper 201 according to one of the examples described herein. The quantization circuit 200 comprises second interface circuitry 208 configured to provide a noise-shaped quantized phase value 212 as the noise-shaped quantized parameter as well as a quantization of the radius value 214 as the quantized further parameter. The second interface circuitry 208 may serve as an output interface to the quantization circuit 200. Much like the first interface circuitry 206, the second interface circuitry 208 may be implemented as a function within a software implementation or as a hardware interface. Since the quantization circuit 200 is illustrated as the part of a polar transmitter in FIG. 2a, the noise-shaped quantized phase value 212 is provided to a digital-to-time converter 222 while the quantized radius value 214 is provided to a digital-to-analog converter 224. The digital-to-time converter 222 provides a series of rectangular pulses having signal edges at positions corresponding to the noise-shaped quantized phase values 212 provided to the DTC 222. Likewise, the digital-to-analog converter provides an analog waveform having an amplitude corresponding to the quantized radius values 214 provided to the DAC 224. The signal output by the digital-to-time converter 222 may be viewed as a phase-modulated carrier signal approximated by rectangular waveforms, while the signal provided by the DAC 224 may be seen as a continuous waveform given by amplitude values associated to the single oscillations of the signal provided by the DTC 222. Both signals are provided to a signal generator 240 which combines both signals to provide a radio frequency signal 250 as an output signal of the polar transmitter. In further embodiments, a Digitally Controlled Oscillator (DCO) may be used to generate the phase modulated carrier signal and, hence, as a substitute for the DTC 222 of the embodiment of FIG. 2. Similar considerations lead to a noise shaped quantization of the instantaneous frequency f of the DCO, since a cycle time T between neighboring waveforms translates to an instantaneous frequency for the VCO by f=1/T.

In the following, it is assumed that the re-quantization of the radius value 204 and the phase value 202 is performed without a change of the sampling frequency. Further examples, however, may simultaneously also change the sampling frequency.

In the application within a polar transmitter, noise shaper 201 receives a phase value and a corresponding radius value in order to determine the best quantization for, at least, the phase value in order to achieve a low error energy at a notch frequency $\omega_0$. The noise shaper 201 comprises an error estimation component 203 which estimates an error within the radio frequency signal 250 using a quantization of the phase value as well as a quantization of a radius value 204. A decision making component 205 within the noise shaper 201 is configured to decide on a use of the quantization of the phase value as the noise-shaped quantized parameter depending on a selection criterion. In particular, estimated errors within the output signal are calculated for different possible quantizations of the phase value for a single or for various different quantizations of the radius value. The decision making component 205 is configured to decide on the use of the quantization of the phase value which results in the lower estimated error, i.e. to use this quantization as the noise-shaped quantized parameter.

Both the error estimation component 203 and the decision making component 205 may be implemented in hard- and or in software. Further examples of error estimation components or decision making components may also be constituted by a combination of a software and a hardware implementation. For example, error estimation may be performed using a dedicated hardware in order to achieve a high performance while the decision on the use may be implemented in software.

For example, for a given quantization of the radius value, e.g. for the closest radius value (the quantization of the radius value having the smallest possible distance between the input radius value and the quantized radius value), the errors $Q_{new1}$ and $Q_{new2}$ within the radio frequency signal may be calculated or estimated by means of:

$$Q_{new1}=Q_{old}+\text{rad}_{closest}(t)*2*(T_{real}-T_{closest})*[\cos(w_0t)-I*\sin(w_0t)];$$

$$Q_{new2}=Q_{old}+\text{rad}_{closest}(t)*2*(T_{real}-T_{SecondClosest})*[\cos(w_0t)-I*\sin(w_0t)]; \text{ wherein}$$

$\text{rad}_{closest}$ corresponds to the radius value, $T_{real}$ corresponds to the parameter, $T_{closest}$ corresponds to the first quantization of the parameter $T_{real}$, $T_{SecondClosest}$ corresponds to the second quantization of the parameter $T_{real}$, $w_0$ corresponds to the notch frequency and $Q_{old}$ corresponds to a remaining error contribution of an antecedent quantization. Apart from considering different quantizations for the phase values at a given quantization $\text{rad}_{closest}$ of the radius value, further examples may also consider different quantizations for the radius value.

For example, four different estimated errors Q1, Q2, Q3 and Q4 may be calculated for two different possible quantizations of each of the phase value and the radius value. Of course, there can, in principle, be several distortions or error components contributing to an error in the output signal within the frequency range of interest or at the notch frequency, where a minimum error energy is desired. One may choose between arbitrarily different radius and phase/timing grid points. For reasons of conciseness, the following table only summarizes the closest and the second closest quantization for each of the radius and the phase values.

| Possibility | Radius | Phase/Time | Error |
|---|---|---|---|
| 1 | Closest radius | Closest phase | Q1 |
| 2 | Closest radius | Second closest phase | Q2 |
| 3 | Second closest radius | Closest phase | Q3 |
| 4 | Second closest radius | Second closest phase | Q4 |

In evaluating the four possibilities of the previous table, one can estimate four different errors and the error estimation minimizing the error energy within the desired frequency range (e.g. at a notch frequency $w_0$) is chosen. Once the decision on the use of the noise-shaped quantized parameter has been made, several practical implementations can be found to achieve the desired use. In FIG. 2a, a feed-forward noise shaper is illustrated which uses a predistorter 209 to apply the chosen quantization to the phase value 202 presently processed and, optionally, to the radius value 204 presently processed.

Figure 2B:
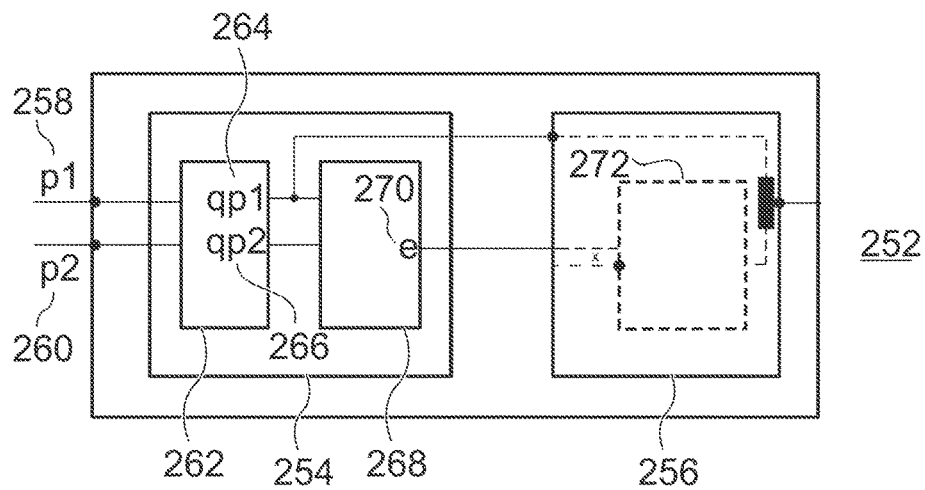
FIG. 2b illustrates a further example of a noise shaper.

FIG. 2b illustrates a further example of a noise shaper as it may be used within a polar transmitter of FIG. 2a or within another application to determine a noise shaped quantized parameter. The noise shaper 252 comprises an error estimation component 254 and a decision making component 256. The error estimation component 254 is configured to receive a parameter 258 (p1) and a further parameter 260 (p2) contributing to generation of an output signal. The output signal is generated using a quantization of the parameter and a quantization of the further parameter and the noise shaper is used to determine an appropriate noise shaped parameter to be used as a substitute for the parameter 258. The error estimation component 254 comprises quantization circuitry 262 configured to calculate a quantization of the parameter 264 (qp1) and a quantization of the further parameter 264 (qp2). The quantized parameters may be calculated using uniform quantization with equal step sizes or non uniform quantization with non equal step sizes. Error calculation circuitry 268 within the error estimation component 254 is configured to calculate an error 270 (e) within the output signal using the quantization of the parameter 264 and the quantization of the further parameter 266. In a practical implementation, this may for example be achieved by calculating the output signal using the parameters 258 and 260 directly and by subtracting the result from the result obtained by calculating the output signal using the quantized parameters 264 and 266.

The decision making component 256 is configured to decide on a use of the quantization of the parameter 264 as the noise shaped quantized parameter depending on the calculated error 270 and a selection criterion. If the selection criterion is fulfilled, the quantization of the parameter 264 as calculated by the quantization circuitry 262 may be used as the noise shaped quantized parameter determined by the noise shaper 252. The selection criterion may be arbitrary. In an example implementation, the error e may be compared to a maximum acceptable value. In another example implementation, the error e may be compared to another estimated error calculated using an alternative quantization of the parameter and the quantization corresponding to the smaller error may be chosen as the noise shaped quantized parameter generated for the parameter 258 (p1).

In order to perform a comparison between the error e and a further quantity x to decide on the use of the quantization of the parameter 264, some examples of decision making components 256 optionally comprise a comparator 272 as illustrated by broken lines in FIG. 2b. If the further quantity x is another estimated error calculated using an alternative quantization of the parameter (due to the chosen selection criterion), the quantization circuitry 262 is configured to calculate a first quantization of the parameter and a second quantization of the parameter, while the error calculation circuitry is configured to calculate a first estimated error within the output signal using the first quantization of the parameter and the quantization of the further parameter as well as to calculate a second estimated error within the output signal using the second quantization of the parameter and the quantization of the further parameter. The comparator 272 within the decision making component 256 is then used to compare the first estimated error and the second estimated error to decide on the use of the quantization of the parameter resulting in the lower estimated error.

Further examples may consider a greater number of possible permutations of quantizations of both, the parameter 258 (p1) and the further parameter 260 (p2) to conclude on the use of the appropriate noise shaped quantized parameter for the parameter 258 (p1). For, example, two possible quantizations of the further parameter 260 (p2) may be considered. If this is the case, quantization circuitry 262 is further configured to calculate a first quantization of the further parameter and a second quantization of the further parameter, while the error calculation circuitry 268 is further configured to calculate a third estimated error within the output signal using the first quantization of the parameter and the second quantization of the further parameter and a fourth estimated error within the output signal using the second quantization of the parameter and the second quantization of the further parameter in order to cover all possible permutations. Likewise, the decision making component is then be configured to decide on the use of the quantization of the parameter and the quantization of the further parameter resulting in the lowest estimated error among the four estimated errors.

Figure 3:
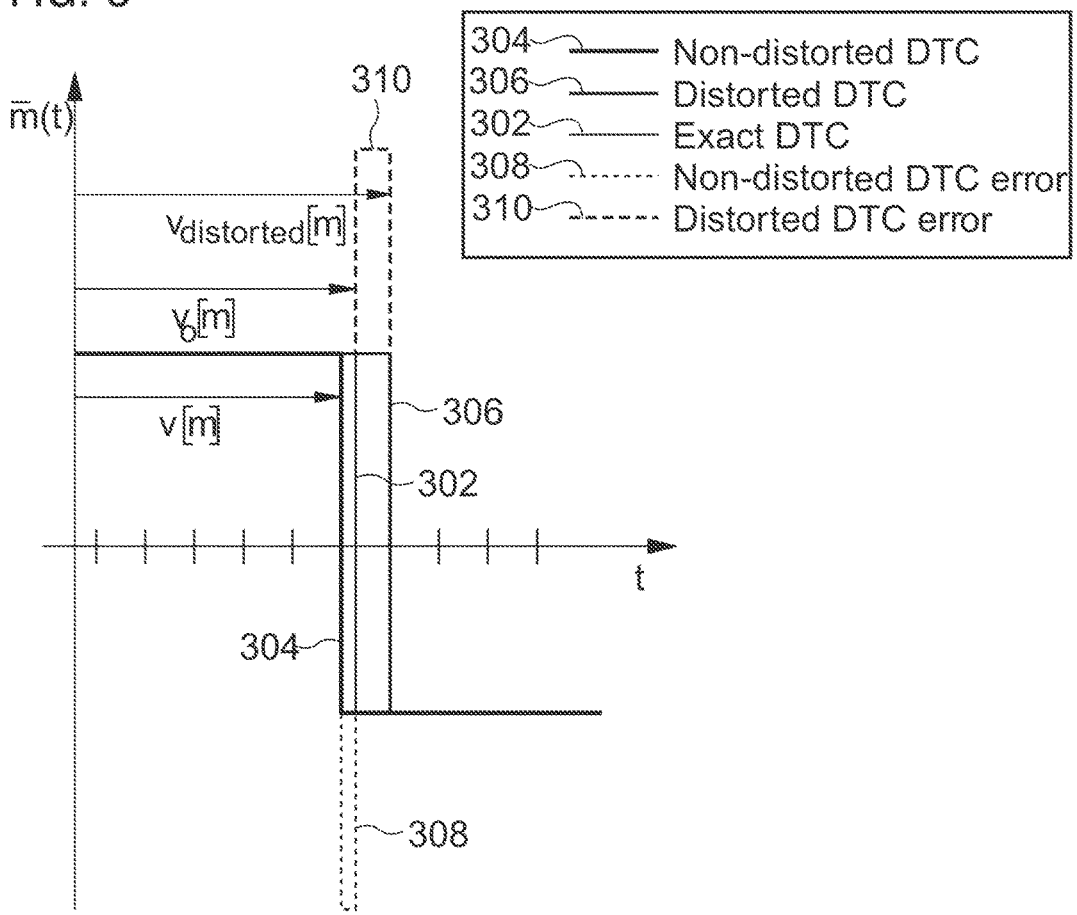
FIG. 3 illustrates quantization errors caused within the polar modulator according to the embodiment of FIG. 2.
Figure 4:
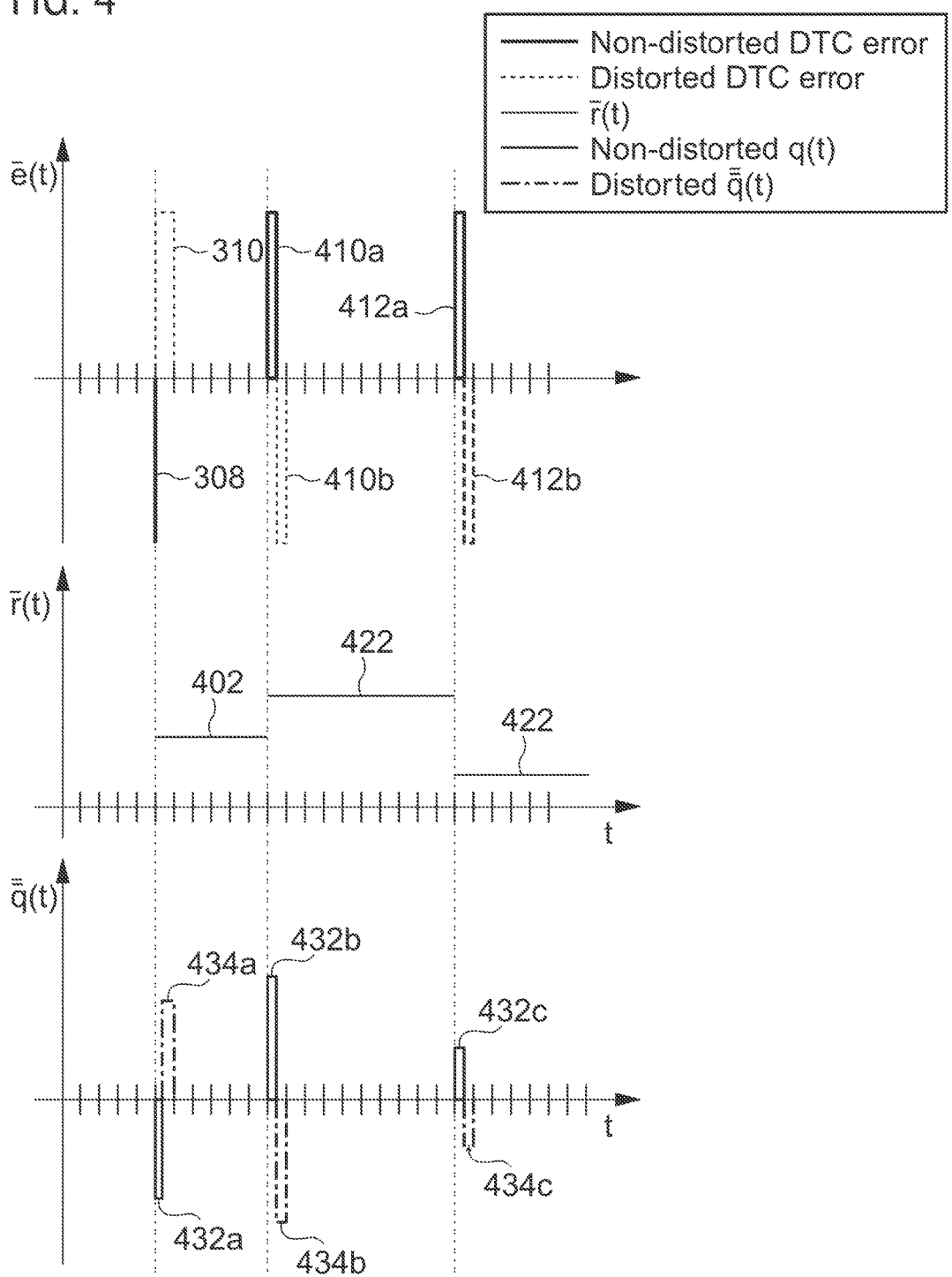
FIG. 4 illustrates the interrelation of the quantized radius value and the quantized phase value and the impact on the error within the generated radio frequency signal.

While FIG. 2b illustrates a possible implementation of a noise shaper using and quantizing arbitrary parameters in more detail, FIGS. 3 and 4 again illustrate the quantization of the radius and phase values within a polar transmitter and the associated errors within the output signal as an example for an implementation of a noise shaper within a polar transmitter. FIG. 3 illustrates, on the x-axis, a timing grid representing a quantization of a desired time (exact DTC) 302 for a phase transition within the output signal. The output of a radio frequency transmitter is $r(t)*\cos(w_0+\varphi(t))$. In a technical solution, the cos ( ) function is replaced by a rect ( ) function, so that the output is $r(t)*\mathrm{rect}(w_0+\varphi(t))$, which is illustrated in FIGS. 3 and 4. The desired time 302 is quantized in order to steer the digital-to-time converter 212 of FIG. 2. To this end, a first quantization 304 (non-distorted DTC) would be a straightforward choice, since the non-distorted DTC is the closest possible quantized value corresponding to the exact DTC value 302. Further, a distorted DTC value may be considered as a second quantization 306 of the DTC value for the estimation of the error within the output signal. The distorted DTC corresponds to $T_{secondclosest}$ in the formula given in the previous paragraph while the non-distorted DTC corresponds to $T_{closest}$. Further, a first estimated error 308 corresponding to the first quantization 302 and a second estimated error 310 corresponding to the second quantization 306 of the phase value is illustrated in FIG. 3 under the constraint that the radius value remains identical, i.e. for a given quantization of the radius value.

For subsequent sample values, however, the radius value changes, as illustrated in FIG. 4. Hence, the estimated error within the output signal does not only depend on the quantization of the phase value but also on the chosen quantization of the radius value. FIG. 4 illustrates, in the second graph, a quantization for three subsequent radius values and, in the lower graph, the resulting errors within the output signal estimated for the two quantizations of the phase values illustrated in FIG. 3.

Very much like in FIG. 3, the additionally illustrated possible quantizations 410a and 412a of the phase value correspond to the closest possible quantization, while the quantizations 410b and 412b correspond to the second closest possible quantizations. The associated radius values 420 and 422 for the last two quantizations are illustrated in the middle graph. The resultant estimated error for the closest quantizations is illustrated by means of estimated errors 432a, 432b and 432c while the error for the second closest quantizations is illustrated by means of the error 434a, 434b, and 434c. In considering both the quantization of the phase value as well as the quantization of the radius value in the determination of the error within the output signal, an error energy within the generated radio frequency signal at a desired notch frequency may be maintained significantly lower as compared to an approach, when the quantization of the timing/phase is performed independently from the quantization of the radius.

In other words, whenever a rising/falling edge or slope of the phase signal is shifted due to time and quantization, the timing error will be multiplied or scaled by the actual radius r(t). In a conventional solution, the timing/phase is quantized independently of the quantization of the radius, leading to undesirable results, in particular for signals or radius and phase components having a high dynamic, i.e. for high bandwidth signals. To this extent it is illustrative to realize that a small timing/phase error weighted with a large radius generates an identical error to a large timing/phase error weighted with a small radius, as illustrated in FIGS. 3 and 4. Consequently, using the joint information of the radius and timing/phase may provide more precise information on the error (in a certain frequency band of interest) than using only the information of the timing/phase alone. Identical considerations hold for the radius values.

Figure 5:
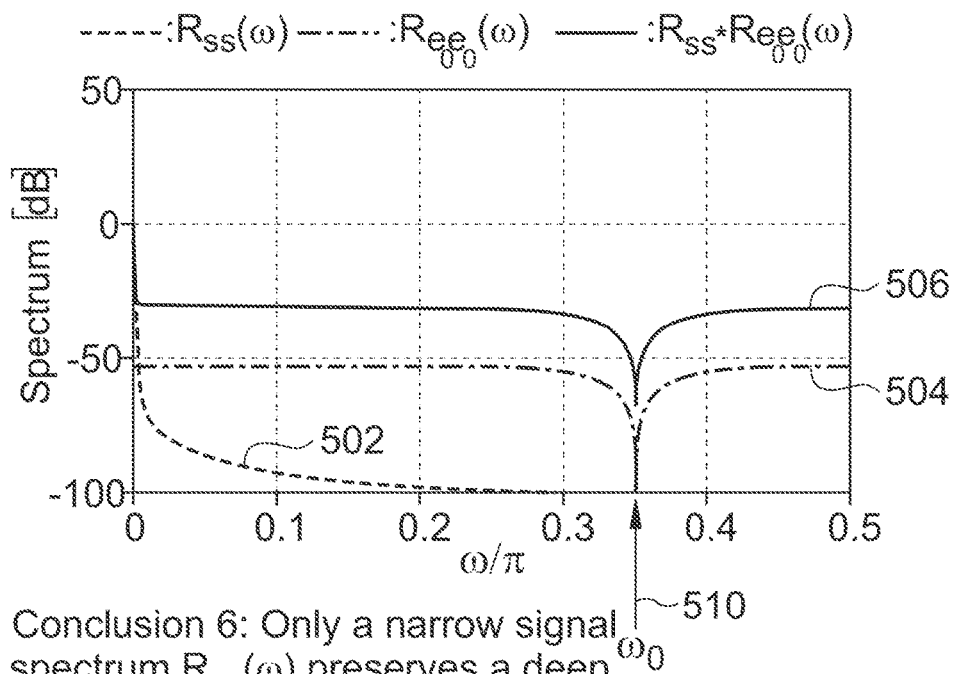
FIG. 5 illustrates noise characteristics of the radio frequency signal and the associated radius and phase signals, comparing a conventional noise shaping approach and an example of a noise shaper.
Figure 5:
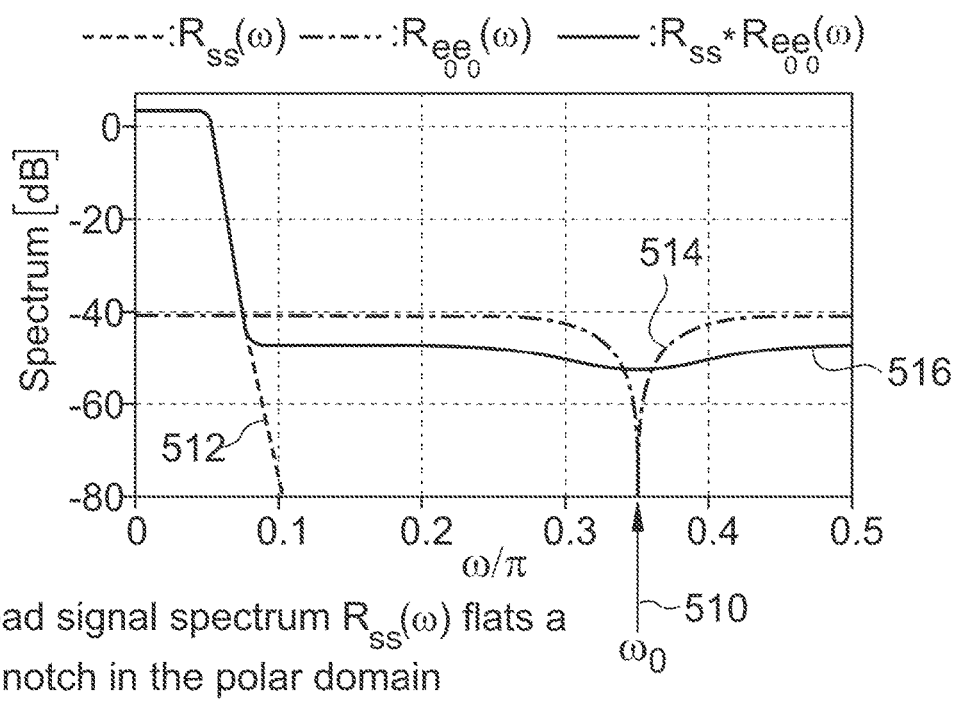

In particular, for slowly varying (narrow band) radio signals, an independent noise shaping for either one of the phase values and the radius values may still be acceptable, as illustrated in the left graph of FIG. 5. The graph illustrates the spectrum of the radius values 502, the phase values 504 and the resultant output signal 506 (radio frequency signal) centered at a desired carrier frequency of a radio frequency communication system. In the left illustration, the spectrum of the radius values 502 is narrow. A notch generated within the spectrum of the phase signal 504 at a notch frequency 510 ($w_0$) by means of conventional noise shaping translates well into a notch at the same frequency within the radio frequency signal 506 as desirable. However, in the case of a radius values 512 exhibiting the broad spectrum illustrated in the right graph, a conventionally generated notch 510 in the spectrum of the phase component 514 does no longer translate into a corresponding notch within the radio frequency signal 516 due to previously-described interrelation between the radius and the phase components.

Figure 6:
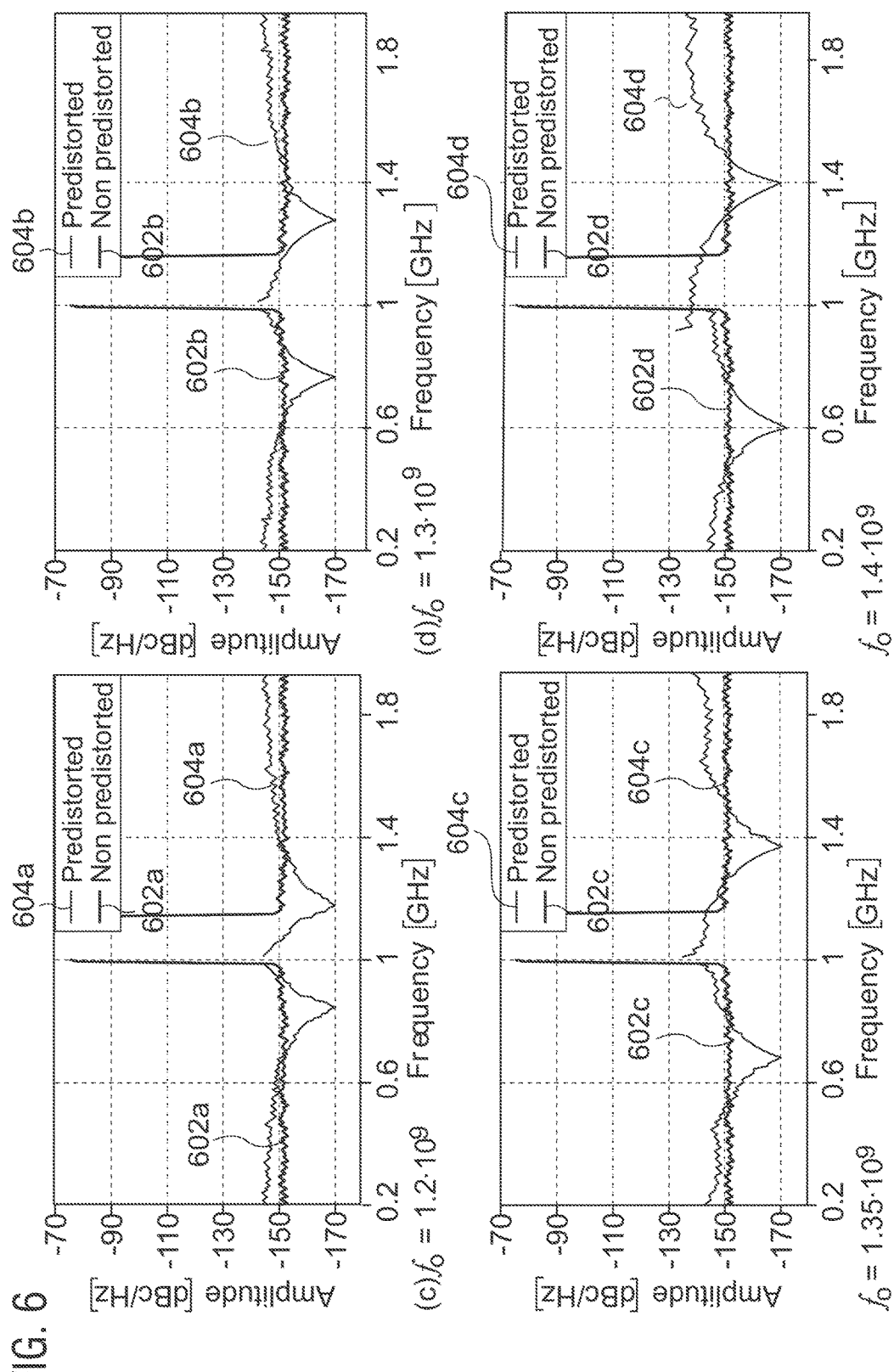
FIG. 6 illustrates examples of different output signals having different noise characteristics.

FIG. 6 illustrates how this problem may be overcome by examples described herein, in particular when noise shapers and methods for determining a noise-shaped quantized parameter contributing to the generation of an output signal are used which consider the quantization of the parameter as well as a quantization of a further parameter contributing to the generation of the output signal.

For signals having a wide band radius component or quickly varying radius values, the four examples shown in FIG. 6 illustrate that the error energy at a desired notch frequency can be significantly reduced when examples of noise shapers are used as compared to the conventional approach illustrated in the right graph of FIG. 5. The desired notch frequency is indicated below each of the four graphs of FIG. 6, while the non predistorted graphs 602a to 602d illustrate the resulting radio frequency signals without the application of noise shaping. The predistorted signals 604a to 604d illustrate the spectra of the radio frequency signals generated using an example of a noise shaper as described herein. It becomes apparent that, although the radius components of the radio frequency signals illustrated in FIG. 6 exhibit a high bandwidth, the desired noise shaping is successfully performed, resulting in a low error energy at the given notch frequencies.

In summary, noise shapers may be generated having notches independent of the signal bandwidth. The noise shapers may also have less out of band noise as compared to conventional noise shapers (at lower and higher signal bandwidth), especially for joint radius and phase noise shaping. If the first parameter to be quantized is the phase value within, for example, a polar transmitter, and the second parameter is considered by means of a quantization of the radius value, the examples described herein may be summarized as joint radius phase noise shapers.

Figure 7:
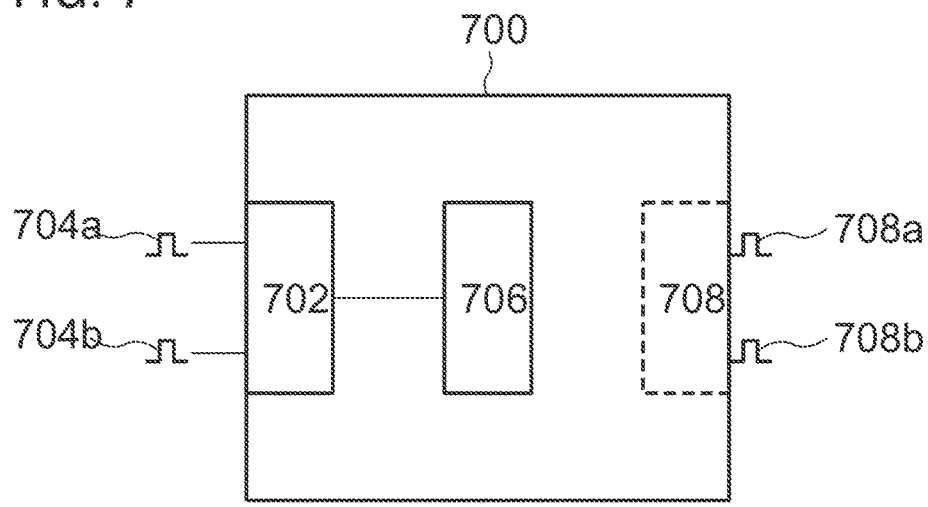
FIG. 7 schematically illustrates an example of a noise shaper.

FIG. 7 schematically illustrates an example of a quantization circuit 700 for determining a quantized parameter contributing the generation of an output signal together with a further parameter. The quantization circuit comprises an input interface 702 which is configured to receive a representation of the parameter 704a and a representation of the further parameter 704b. The representation of the parameters may be an arbitrary representation suitable to quantify the parameter. For example, a real valued number may be used as a representation of the parameter, while other examples may use a quantized value to represent the parameter.

The quantization circuit further comprises a noise shaper 706 according to one of the examples described herein. Optionally, the quantization circuit 700 further comprises an output interface 708 which is configured to provide the noise-shaped quantized parameter 708a together with a quantization of the further parameter 708b.

Figure 8:
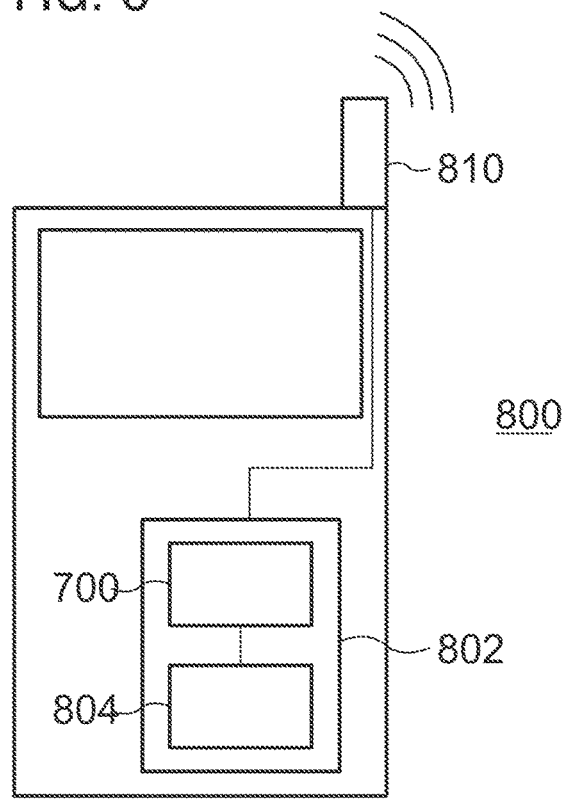
FIG. 8 illustrates an example of a mobile telecommunications device having a transmitter using a noise shaper of FIG. 7.

FIG. 8 schematically illustrates an example of a mobile telecommunications device 800 comprising a transmitter 802 having a radio frequency generator comprising an example of a quantization circuit 700. The output of the quantization circuit 700, i.e. the quantized parameter and the quantized further parameter are combined by means of a signal combiner 804 in order to provide or generate a radio frequency signal. The radio frequency signal can be radiated into the environment by means of an antenna 810 of the mobile telecommunications device 800.

Example 1 is a method for determining a noise shaped quantized parameter contributing to generation of an output signal, comprising estimating an error within the output signal using a quantization of the parameter and a quantization of a further parameter contributing to generation of the output signal; and using the quantization of the parameter as the noise shaped quantized parameter according to a selection criterion.

In Example 2, the method of example 1 optionally further comprises calculating a first estimated error within the output signal using a first quantization of the parameter and a first quantization of the further parameter; calculating a second estimated error within the output signal using a second quantization of the parameter and the first quantization of the further parameter; and using the quantization of the parameter resulting in the lower estimated error as the noise shaped quantized parameter.

In Example 3, the method of example 1 or 2 optionally further comprises calculating a third estimated error within the output signal using the first quantization of the parameter and a second quantization of the further parameter; calculating a fourth estimated error within the output signal using the second quantization of the parameter and the second quantization of the further parameter; and using the quantization of the parameter and the quantization of the further parameter resulting in the lowest estimated error as the noise shaped quantized parameter and as a noise shaped quantized further parameter.

In Example 4 in the method of example 2 or 3, wherein the first quantization corresponds to the smallest possible distance between the first quantization of the parameter and the parameter; and wherein the second quantization corresponds to the second smallest possible distance between the second quantization of the parameter and the parameter for the quantization scheme used.

In Example 5, in the method of any of examples 2 to 4, calculating the first estimated error and the second estimated error comprises: using an information on a notch frequency at which the error within the a spectrum of the output signal shall be small.

In Example 6, in the method of any of the preceding examples, the parameter corresponds to a phase value of an output signal and wherein the further parameter corresponds to a radius value of the output signal.

In Example 7, in the method of example 6, the calculation of the first estimated error $Q_{new1}$ and of the second estimated error $Q_{new2}$ is based on the following expressions:

$$Q_{new1} = Q_{old} + \text{rad}_{closest} * 2 ** [\cos - I * \sin];$$

$$Q_{new2} = Q_{old} + \text{rad}_{closest} * 2 ** [\cos - I * \sin]; \text{ wherein}$$

$\text{rad}_{closest}$ corresponds to the radius value, $T_{real}$ corresponds to the parameter, $T_{closest}$ corresponds to the first quantization of the parameter $T_{real}$, $T_{SecondClosest}$ corresponds to the second quantization of the parameter $T_{real}$, $w_0$ corresponds to the notch frequency and $Q_{old}$ corresponds to a remaining error contribution of an antecedent quantization.

Example 8 is a method for generating a radio frequency signal based on a phase value as a parameter and a radius value as a further parameter, comprising calculating a first estimated error within the radio frequency signal using a first quantization of the phase value and a quantization of the radius value; calculating a second estimated error within the radio frequency signal using a second quantization of the phase value and the quantization of the radius value; and using the quantization of the phase value resulting in the lower estimated error as a noise shaped quantized phase value.

In Example 9, in the method of example 8, the calculation of the first estimated error and the calculation of the second estimated error use a remaining error contribution of an antecedent quantization.

In Example 10, the method of examples 8 or 9, optionally further comprises using the noise shaped quantized phase value to determine a first analog signal having a phase characteristic depending on the quantized phase value; and using the quantization of the radius value to determine a second analog signal having an amplitude depending on the quantized radius value.

In Example 11, the method of example 10, optionally further comprises combining the first analog signal and the second analog signal to generate the radio frequency signal.

Example 12 is a noise shaper for determining a noise shaped quantized parameter contributing to generation of an output signal, comprising an error estimation component configured to receive a parameter and a further parameter contributing to the generation of the output signal, comprising: quantization circuitry configured to calculate a quantization of the parameter and a quantization of the further parameter; and error calculation circuitry configured to calculate an error within the output signal using the quantization of the parameter and the quantization of the further parameter; and a decision making component configured to decide on a use of the quantization of the parameter as the noise shaped quantized parameter depending on the calculated error and a selection criterion.

In Example 13, in the noise shaper of example 12, the quantization circuitry is configured to calculate a first quantization of the parameter and a second quantization of the parameter; and the error calculation circuitry is configured to calculate a first estimated error within the output signal using the first quantization of the parameter and the quantization of the further parameter and to calculate a second estimated error within the output signal using the second quantization of the parameter and the quantization of the further parameter; and wherein the decision making component comprises a comparator configured to compare the first estimated error and the second estimated error to decide on the use of the quantization of the parameter resulting in the lower estimated error.

In Example 14, in the noise shaper of example 13, the quantization circuitry is further configured to calculate a first quantization of the further parameter and a second quantization of the further parameter; the error calculation circuitry is further configured to calculate a third estimated error within the output signal using the first quantization of the parameter and the second quantization of the further parameter and a fourth estimated error within the output signal using the second quantization of the parameter and the second quantization of the further parameter; and wherein the comparator of the decision making component is configured to decide on the use of the quantization of the parameter and the quantization of the further parameter resulting in the lowest estimated error.

Example 15 is a quantization circuit for determining a noise shaped quantized parameter contributing to generation of an output signal together with a further parameter, comprising first interface circuitry configured to receive a representation of the parameter and a representation of the further parameter; a noise shaper according to any of examples 11 to 14.

In Example 16, the quantization circuit of example 15 optionally further comprises second interface circuitry configured to provide the noise shaped quantized parameter and a quantization of the further parameter as a quantized further parameter.

Example 17 is a radio frequency generator for generating a radio frequency signal based on a parameter and on a further parameter, comprising a quantization circuit according to example 15 or 16.

In Example 18, the radio frequency generator of example 17 optionally further comprises a signal combiner configured to combine a first signal depending on the noise shaped quantized parameter and a second signal depending on the quantized further parameter to provide the output signal.

In Example 19, in the radio frequency generator of example 18, the signal combiner comprises a first digital to analog converter configured to provide an analog representation of the noise shaped quantized parameter; a second digital to analog converter configured to provide an analog representation of the quantized further parameter; and a signal generator configured to combine the analog representation of the noise shaped quantized parameter and the analog representation of the quantized further parameter.

In Example 20, in the radio frequency generator of any of examples 17 to 19, the parameter indicates a phase component of the radio frequency signal and the further parameter indicates a radius component of the radio frequency signal.

Example 21 is a transmitter comprising a radio frequency generator of any of examples 17 to 20.

Example 22 is a mobile telecommunications device comprising a transmitter according to example 21.

Example 23 is an apparatus for determining a noise shaped quantized parameter contributing to generation of an output signal, comprising an error estimating means adapted to estimate an error within the output signal using a quantization of the parameter and a quantization of a further parameter contributing to generation of the output signal; and a processing means adapted to implement the quantization of the parameter as the noise shaped quantized parameter depending on a selection criterion.

In Example 24, the apparatus of example 23 optionally further comprises means for calculating a first estimated error within the output signal using a first quantization of the parameter and a first quantization of the further parameter; means for calculating a second estimated error within the output signal using a second quantization of the parameter and the first quantization of the further parameter; and means for using the quantization of the parameter resulting in the lower estimated error as the noise shaped quantized parameter.

In Example 25, the apparatus of example 24 optionally further comprises means for calculating a third estimated error within the output signal using the first quantization of the parameter and a second quantization of the further parameter; means for calculating a fourth estimated error within the output signal using the second quantization of the parameter and the second quantization of the further parameter; and means for using the quantization of the parameter and the quantization of the further parameter resulting in the lowest estimated error as the noise shaped quantized parameter and as a noise shaped quantized further parameter.

Example 26 is a computer program having a program code configured to perform the method of any of examples 1 to 11, when the program code is executed on a computer or processor.

Example 27 is a machine readable medium including code to cause a machine to perform the method of any of examples 1 to 11 if the code is executed by the machine.

The aspects and features mentioned and described together with one or more of the previously detailed examples and figures, may as well be combined with one or more of the other examples in order to replace a like feature of the other example or in order to additionally introduce the feature to the other example.

Examples may further be a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and nonvolatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other example examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for determining a noise shaped quantized parameter contributing to generation of an output signal, comprising:

estimating errors within the output signal using at least two quantizations of a parameter and at least one quantization of a further parameter contributing to generation of the output signal;

selecting one of the at least two quantizations of the parameter based on a selection criteria;

using the selected quantization of the parameter as the noise shaped quantized parameter, wherein a first estimated error within the output signal is calculated using a first quantization of the parameter and a first quantization of the further parameter, a second estimated error within the output signal is calculated using a second quantization of the parameter and the first quantization of the further parameter, and one of the first quantization or the second quantization of the parameter resulting in a lower estimated error is selected as the noise shaped quantized parameter, wherein the parameter corresponds to a phase value of the output signal and the further parameter corresponds to a radius value of the output signal, wherein the calculation of the first estimated error $Q_{new1}$ and of the second estimated error $Q_{new2}$ is based on the following expressions:

$$Q_{new1} = Q_{old} + \text{rad}_{closest}(t) * 2 * (T_{real} - T_{closest}) * [\cos(w_0 t) - I * \sin(w_0 t)];$$

$$Q_{new2} = Q_{old} + \text{rad}_{closest}(t) * 2 * (T_{real} - T_{SecondClosest}) * [\cos(w_0 t) - I * \sin(w_0 t)]$$

wherein $\text{rad}_{closest}$ corresponds to a radius value, $T_{real}$ corresponds to the parameter, $T_{closest}$ corresponds to the first quantization of the parameter $T_{real}$, $T_{SecondClosest}$ corresponds to the second quantization of the parameter $T_{real}$, $w_0$ corresponds to a notch frequency and $Q_{old}$ corresponds to a remaining error contribution of an antecedent quantization.

2. The method of claim 1, further comprising:

calculating a third estimated error within the output signal using the first quantization of the parameter and a second quantization of the further parameter;

calculating a fourth estimated error within the output signal using the second quantization of the parameter and the second quantization of the further parameter; and selecting a combination of one of the first quantization or the second quantization of the parameter and one of the first quantization or the second quantization of the further parameter resulting in a lowest estimated error as the noise shaped quantized parameter and as a noise shaped quantized further parameter.

3. The method of claim 1, wherein the first quantization corresponds to a smallest possible distance between the first quantization of the parameter and the parameter; and wherein the second quantization corresponds to a second smallest possible distance between the second quantization of the parameter and the parameter for a quantization scheme used.

4. The method of claim 1, wherein calculating the first estimated error and the second estimated error comprises:
using information on a notch frequency at which the error within a spectrum of the output signal is small.

5. A method for generating a radio frequency signal based on a phase value as a parameter and a radius value as a further parameter, comprising:
calculating a first estimated error within the radio frequency signal using a first quantization of the phase value and a quantization of the radius value;
calculating a second estimated error within the radio frequency signal using a second quantization of the phase value and the quantization of the radius value; and
selecting one of the first quantization or the second quantization of the phase value based on a selection criteria;
using the selected quantization of the phase value resulting in a lower estimated error as a noise shaped quantized phase value;
using the noise shaped quantized phase value to determine a first analog signal having a phase characteristic depending on the quantized phase value; and
using the quantization of the radius value to determine a second analog signal having an amplitude depending on the quantized radius value.

6. The method of claim 5, wherein the calculation of the first estimated error and the calculation of the second estimated error use a remaining error contribution of an antecedent quantization.

7. The method of claim 5, further comprising:
combining the first analog signal and the second analog signal to generate the radio frequency signal.

8. A noise shaper for determining a noise shaped quantized parameter contributing to generation of an output signal, comprising:
an error estimation component configured to receive a parameter and a further parameter contributing to the generation of the output signal, comprising: quantization circuitry configured to calculate at least two quantizations of the parameter and at least one quantization of the further parameter;
error calculation circuitry configured to calculate errors within the output signal using the at least two quantizations of the parameter and the at least one quantization of the further parameter; and
a decision making component configured to select one of the at least two quantizations of the parameter based on the error as the noise shaped quantized parameter, wherein the error calculation circuitry is configured to calculate a first estimated error within the output signal using a first quantization of the parameter and a first quantization of the further parameter and calculate a second estimated error within the output signal using a second quantization of the parameter and the first quantization of the further parameter, and the decision making component is configured to select one of the first quantization or the second quantization of the parameter resulting in a lower estimated error as the noise shaped quantized parameter, wherein the parameter corresponds to a phase value of the output signal and the further parameter corresponds to a radius value of the output signal, wherein the calculation of the first estimated error $Q_{new1}$ and of the second estimated error $Q_{new2}$ is based on the following expressions:

$$Q_{new1}=Q_{old}+\text{rad}_{closest}(t)*2*(T_{real}-T_{closest})*[\cos(w_0t)-I*\sin(w_0t)];$$

$$Q_{new2}=Q_{old}+\text{rad}_{closest}(t)*2*(T_{real}-T_{SecondClosest})*[\cos(w_0t)-I*\sin(w_0t)]$$

wherein $\text{rad}_{closest}$ corresponds to a radius value, $T_{real}$ corresponds to the parameter, $T_{closest}$ corresponds to the first quantization of the parameter $T_{real}$, $T_{SecondClosest}$ corresponds to the second quantization of the parameter $T_{real}$, $w_0$ corresponds to a notch frequency and $Q_{old}$ corresponds to a remaining error contribution of an antecedent quantization.

9. The noise shaper of claim 8, wherein:
the quantization circuitry is further configured to calculate a second quantization of the further parameter; and
the error calculation circuitry is further configured to calculate a third estimated error within the output signal using the first quantization of the parameter and the second quantization of the further parameter and a fourth estimated error within the output signal using the second quantization of the parameter and the second quantization of the further parameter;
wherein the decision making component is configured to select a combination of one of the first quantization or the second quantization of the parameter and one of the first quantization or the second quantization of the further parameter resulting in a lowest estimated error.

10. An apparatus for determining a noise shaped quantized parameter contributing to generation of an output signal, comprising:
an error estimating means adapted to estimate errors within the output signal using at least two quantizations of a parameter and at least one quantization of a further parameter contributing to generation of the output signal; and
a processing means adapted to select one of the at least two quantizations of the parameter based on a selection criteria and use the selected quantization of the parameter as the noise shaped quantized parameter,
wherein the error estimating means is configured to calculate a first estimated error within the output signal using a first quantization of the parameter and a first quantization of the further parameter and calculate a second estimated error within the output signal using a second quantization of the parameter and the first quantization of the further parameter, and the processing means is configured to select one of the first quantization or the second quantization of the parameter resulting in a lower estimated error as the noise shaped quantized parameter, wherein the parameter corresponds to a phase value of the output signal and the further parameter corresponds to a radius value of the output signal, wherein the calculation of the first estimated error $Q_{new1}$ and of the second estimated error $Q_{new2}$ is based on the following expressions:

$$Q_{new1} = Q_{old} + \text{rad}_{closest}(t) * 2 * (T_{real} - T_{closest}) * [\cos(w_0 t) - I * \sin(w_0 t)];$$

$$Q_{new2} = Q_{old} + \text{rad}_{closest}(t) * 2 * (T_{real} - T_{SecondClosest}) * [\cos(w_0 t) - I * \sin(w_0 t)]$$

wherein $\text{rad}_{closest}$ corresponds to a radius value, $T_{real}$ corresponds to the parameter, $T_{closest}$ corresponds to the first quantization of the parameter $T_{real}$, $T_{SecondClosest}$ corresponds to the second quantization of the parameter $T_{real}$, $w_0$ corresponds to a notch frequency and $Q_{old}$ corresponds to a remaining error contribution of an antecedent quantization.

* * * * *